United States Patent
Kim et al.

[11] Patent Number: 5,804,883
[45] Date of Patent: Sep. 8, 1998

[54] BONDING PAD IN SEMICONDUCTOR DEVICE

[75] Inventors: Hong-beom Kim, Yongin; Seong-min Lee, Seoul, both of Rep. of Korea

[73] Assignee: Samsung Electronics Co., Ltd., Suwon, Rep. of Korea

[21] Appl. No.: 679,450

[22] Filed: Jul. 12, 1996

[30] Foreign Application Priority Data

Jul. 13, 1995 [KR] Rep. of Korea ....................... 95-20642

[51] Int. Cl.$^6$ ........................... H01L 23/29; H01L 23/31; H01L 27/02
[52] U.S. Cl. ........................... 257/786; 257/784; 257/781
[58] Field of Search ................................... 257/786, 782, 257/784, 781, 667

[56] References Cited

U.S. PATENT DOCUMENTS

| | | | |
|---|---|---|---|
| 4,558,345 | 12/1985 | Dwyer et al. | 257/784 |
| 4,625,227 | 11/1986 | Hara et al. | 257/669 |
| 4,654,692 | 3/1987 | Sakurai et al. | 257/775 |
| 5,288,539 | 2/1994 | Araki | 257/674 |
| 5,289,036 | 2/1994 | Nishimoto | 257/774 |
| 5,291,060 | 3/1994 | Shimizu et al. | 257/676 |
| 5,329,162 | 7/1994 | Nadaoka | 257/786 |
| 5,444,186 | 8/1995 | Eguchi | 257/750 |
| 5,550,402 | 8/1996 | Nicklaus | 257/684 |

FOREIGN PATENT DOCUMENTS

| | | | |
|---|---|---|---|
| 60-94765 | 5/1985 | Japan | 257/784 |
| 60-242631 | 12/1985 | Japan | 257/786 |
| 63-141330 | 6/1988 | Japan . | |
| 2-90634 | 3/1990 | Japan . | |
| 2-168656 | 6/1990 | Japan . | |
| 2-285649 | 11/1990 | Japan . | |
| 3-149831 | 6/1991 | Japan . | |
| 5-226405 | 9/1993 | Japan . | |

OTHER PUBLICATIONS

John H. Lau, "Thermal Stress And Strain In Microelectronics Packaging", Van Nostrand Reinhold, 1993, pp. 430–434.

*Primary Examiner*—Tom Thomas
*Assistant Examiner*—Alexander Oscar Williams
*Attorney, Agent, or Firm*—Jones & Volentine, L.L.P.

[57] ABSTRACT

A bonding pad in a semiconductor device having at least one slit is provided. In the semiconductor device including a passivation layer covering the bonding pad and metal wiring, at least one slit is formed on the bonding pad for electrically connecting the metal wiring to external leads of the semiconductor device. The slit formed in the bonding pad may be filled with a molding compound to buffer the stresses caused by a wire-bonding process. Hence, stress-induced corrosion may be reduced and PCT reliability may be enhanced.

7 Claims, 1 Drawing Sheet

BONDING PAD IN SEMICONDUCTOR DEVICE

BACKGROUND OF THE INVENTION

The present invention relates to a semiconductor device, and more particularly, to a bonding pad in a semiconductor device.

Generally, in a manufacturing process for a semiconductor device, a passivation layer is deposited on the whole uppermost surface of a wafer after a final metal layer is patterned. The passivation layer serves as an insulating and protective layer to prevent a chip from being mechanically or chemically damaged during the assembly and package processes that follow.

Widely utilized for the passivation layer are phosphosilicate glass (PSG) having a characteristic of superior gettering natrium ions and another metallic contaminant which is quickly diffusing, and a silicon nitride layer formed by plasma enhanced chemical vapor deposition (PECVD). After its formation, the passivation layer is etched to form a series of metalized patterns as openings which expose the layer under the passivation layer. A plurality of exposed metal patterns, each being referred to as "a bonding pad," are usually positioned at the periphery of the chip. Wires are coupled to a metallic surface of the bonding pad, followed by packaging of the chip. In this manner, the coupling between the chip package and package leads is achieved.

Therefore, in a conventional semiconductor device, since the metal wiring in the above metal pattern has a rectangular shape, a bonding pad 10 is formed to be square as shown in FIG. 1.

Unfortunately, reliability tests have shown that under the square structure stresses occur due to the different thermal expansion coefficients between a silicon chip and a molding compound. Such stresses can be concentrated on the four corners of the bonding pad and cause damage to the passivation layer. Also, when the bonding pad is subjected to thermal pressure for the wire-bonding in an assembly process, stress concentration can be induced between the bonding pad and wire since metal strain is restricted by rigid passivation around the bonding pad. Such stress concentration can trigger stress-induced corrosion to result in PCT (pressure cooker test) inferiority or cracks of the bonding wire which decreases the reliability of the package.

Accordingly, in recent memory products, the bonding pad is designed to have the shape of a regular octagon 20 by cutting off the four corners from the square-structured bonding pad. An example of such a bonding pad is shown in FIG. 2.

Moreover, it has been disclosed that when a semiconductor substrate having a metal line structure is molded in a common resin molding method, shear stress is applied to the four corners of a rectangular semiconductor substrate. Such shear stress is due to a molding resin material (Lau John, H., "Thermal Stress and Strain in Microelectronic Package," Van Nostrand Reinhol, 1993, pp. 430–434), which causes stress at the four corners. This is due to mismatch of thermal displacement between a chip and a resin. It leads to cracks in the four corners of the chip in the passivation film 30a (see e.g., FIG. 3) which is formed on a metal layer of the chip. Such cracks cause deterioration of the characteristics of a semiconductor device.

To prevent such phenomenon, a method of forming an L-type slit along the metal line at the chip corners has been proposed (U.S. Pat. No. 5,023,699, "Resin Molded Type Semiconductor Device Having a Conductor Film," 1991, Hitachi). However, such a method does not consider adequately the stress applied to the pad inside the chip. Such stress concentration also triggers stress-induced corrosion that leads to PCT (pressure cooker test) inferiority or diminished package reliability, which are caused by cracks in the bonding wire.

SUMMARY OF THE INVENTION

To solve one or more of the above problems, it is an object of the present invention to provide a bonding pad of a semiconductor device that enhances the reliability of the device by buffering stress that is applied to the bonding pad in a process of assembling the semiconductor device.

Accordingly, to achieve the above object, there is provided a bonding pad in a semiconductor device having a passivation layer covering the bonding pad and metal wiring, wherein a slit is formed on the bonding pad for electrically connecting the metal wiring to external leads of the semiconductor device.

It is preferred in the present invention that the slit is formed along the edge of the bonding pad. The slit can be continuously or discontinuously formed, and the number of the slits can be more than one.

According to the present invention, stress on the pad applied during a wire-bonding process can be accommodated to a certain degree by the molding compound filling the slit(s). Hence, the stress corrosion is restrained to improve the PCT reliability of the semiconductor device.

DETAILED DESCRIPTION OF THE INVENTION

The above objects and advantages of the present invention will become more apparent by the detailed description below of preferred embodiments thereof and by referring to the attached drawings.

Figure 1:
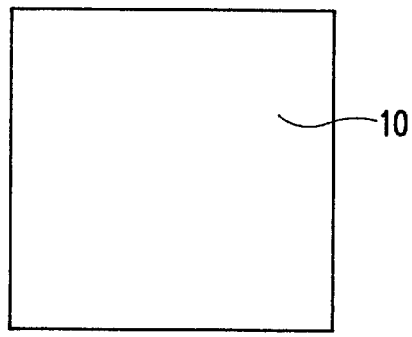
FIG. 1 is a plan view having a bonding pad in a conventional and generally square form.
Figure 2:
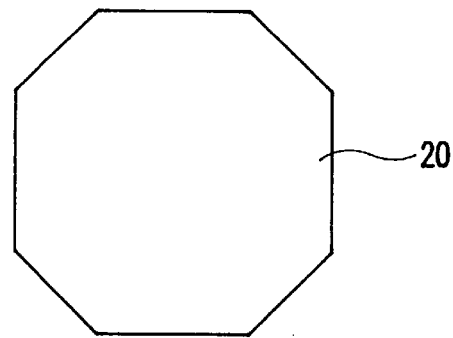
FIG. 2 is a plan view of a bonding pad having a conventional octagonal form.
Figure 3:
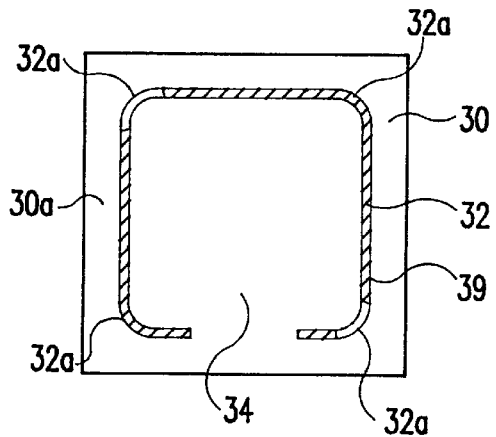
FIG. 3 is plan view of a bonding pad according to one embodiment of the present invention including at least one slit in a continuous line except for at least one portion.
Figure 4:
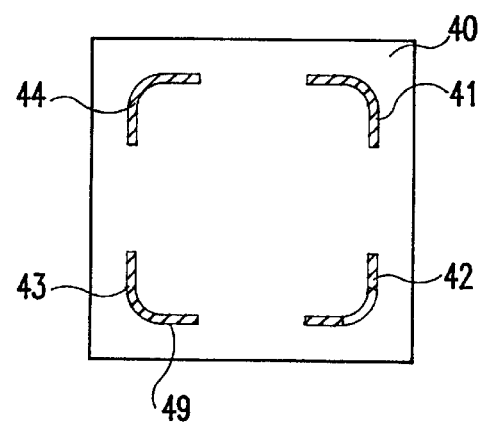
FIG. 4 is plan view of a bonding pad according to a second embodiment of the present invention including at least one slit formed discontinuously in each corner of the bonding pad.
Figure 5:
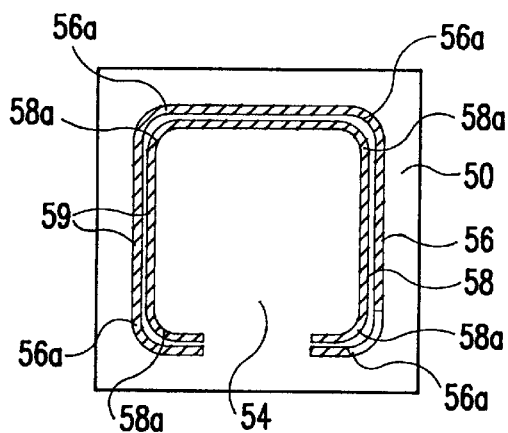
FIG. 5 is plan view of a bonding pad according to third embodiment of the present invention including a first slit in a continuous line except for at least one portion and having a second slit located concentrically to the first slit which second slit is formed in a continuous line except for at least one portion.

FIGS. 3 to 5 are plan views of bonding pads covered by a passivation film 30a according to the present invention including at least one slit adapted for wire-bonding.

FIG. 3 shows a bonding pad according to an embodiment of the present invention. In the drawing, slit 32 is a line formed continuously along the edge of a bonding pad 30 such that a molding compound 39 filled therein can accommodate stresses applied to the bonding pad during a wire-bonding assembly process. Note the portion of the slit 32a at the corners of the bonding pad 30 are curved to further reduce stress concentration. Preferably, a slit having a width of 3 μm or more is formed along the edge of the bonding pad, exclusive of a portion 34 toward the chip center, for effective stress-accommodation. As a result, the slit which is filled with a ductile molding compound serves as a buffer to the stresses caused by the wire-bonding.

FIG. 4 shows a second embodiment of the invention, which is a bonding pad having a plurality of slits formed as a discontinuous line along the edge of the bonding pad.

Preferably, each of the plurality of slits is a single-lined curved slit, which is shown in FIG. 4 as 41, 42, 43 and 44, respectively, having a width of 3 μm or more, which is formed discontinuously in each corner of a bonding pad 40. Each slit is filled with the ductile molding compound 49 which serves as a buffer to the stresses caused by the wire-bonding.

FIG. 5 shows a bonding pad according to a third embodiment of the present invention, wherein two-lined slits are formed. A first slit 56 is formed continuously along the edge of bonding pad 50 and a second slit 58 is formed continuously just inside the first slit. Each of the slits 56 and 58 have a gap at the portion 54. Note the portion of the slits 56a and 58a at the corners of the bonding pad 50 are curved to further reduce stress concentration.

In the drawing, the two slits 56 and 58, having a width of 3 μm or more, respectively, are formed along the edge of a bonding pad 50, exclusive of a portion 54 toward the chip center on one edge of the chip. Thus, the slits which are filled with a ductile molding compound 59 may serve as a buffer to the stresses caused by the wire-bonding. The number of slits in this third embodiment is illustrated as two slits, but more slits may be provided inside these slits. Further, various other slit types may be used for the proper prevention of stresses introduced to the inside of the bonding pad.

In the present invention, it is preferred that the slit formed in the bonding pad be filled with a molding compound. Particularly, preferred molding compounds have 2.5 or more times the ductility of aluminum metal.

As described above, the slit formed in the bonding pad which is filled with the molding compound can serve to buffer the stresses caused by a wire-bonding process. Accordingly, stress-induced corrosion may be reduced and PCT reliability may be enhanced for a semiconductor device.

While this invention has been described with respect to that which is presently considered to be the most practical and preferred embodiments, it is to be understood that the invention is not limited to the disclosed embodiments. It is apparent that variations and modifications by those skilled in the art can be effected within the spirit and scope of the present invention as defined in the appended claims. Thus, it is intended that the present invention cover such various modifications and equivalent arrangements within the spirit and scope of the appended claims.

What is claimed is:

1. A semiconductor bonding pad in a semiconductor device covered by an elongated passivation layer, wherein said bonding pad has a slit formed along a periphery of the bonding pad to reduce stresses caused by wire bonding, said slit having arcuate portions at corners of the bonding pad.

2. A semiconductor bonding pad according to claim 1, wherein said slit is continuously formed along the periphery of the bonding pad.

3. A semiconductor bonding pad according to claim 1, wherein said slit is discontinuously formed along the periphery of the bonding pad, thereby forming a plurality of arcuate slits at the corners of the bonding pad.

4. A semiconductor bonding pad according to claim 1, wherein said slit is filled with a molding compound.

5. A semiconductor bonding pad according to claim 1, further comprising another elongated slit formed concentrically to the slit, said another slit having arcuate portions at the corners of the bonding pad corresponding to the arcuate portions of the slit.

6. A semiconductor bonding pad according to claim 5, wherein said slit and said another slit are filled with a molding compound.

7. A semiconductor bonding pad in a semiconductor device covered by a passivation layer, said bonding pad having a plurality of elongated slits concentrically and continuously formed along a periphery of the bonding pad to reduce stresses caused by wire bonding, said slits having arcuate portions at corners of the bonding pad, said slits being filled with a molding compound, wherein said molding compound has a ductility at least 2.5 times the ductility of aluminum metal.

* * * * *